United States Patent
Jerez et al.

(10) Patent No.: US 9,793,094 B2
(45) Date of Patent: Oct. 17, 2017

(54) EXTRACTION ELECTRODE

(71) Applicants: Manuel A. Jerez, Roosevelt, NY (US); Carlos F. M. Borges, Roslyn, NY (US)

(72) Inventors: Manuel A. Jerez, Roosevelt, NY (US); Carlos F. M. Borges, Roslyn, NY (US)

(73) Assignee: Ion Technology Solutions, LLC, Mineola, NY (US)

(*) Notice: Subject to any disclaimer, the term of this patent is extended or adjusted under 35 U.S.C. 154(b) by 509 days.

(21) Appl. No.: 14/222,953

(22) Filed: Mar. 24, 2014

(65) Prior Publication Data

US 2015/0270100 A1     Sep. 24, 2015

(51) Int. Cl.
| H01J 3/14 | (2006.01) |
| H01J 37/317 | (2006.01) |
| H01J 37/08 | (2006.01) |

(52) U.S. Cl.
CPC .......... *H01J 37/3171* (2013.01); *H01J 37/08* (2013.01); *H01J 2237/032* (2013.01)

(58) Field of Classification Search
None
See application file for complete search history.

(56) References Cited

U.S. PATENT DOCUMENTS

| 5,554,854 | A | * | 9/1996 | Blake | H01J 37/3002 |
| | | | | | 250/492.2 |
| 5,920,076 | A | * | 7/1999 | Burgin | H01J 27/022 |
| | | | | | 250/423 R |
| 6,501,078 | B1 | * | 12/2002 | Ryding | H01J 37/08 |
| | | | | | 250/396 R |
| 6,559,454 | B1 | * | 5/2003 | Murrell | H01J 27/022 |
| | | | | | 250/423 R |
| 2006/0272775 | A1 | * | 12/2006 | Horsky | C23C 14/48 |
| | | | | | 156/345.37 |
| 2008/0223409 | A1 | * | 9/2008 | Horsky | B08B 7/00 |
| | | | | | 134/22.1 |
| 2010/0072402 | A1 | * | 3/2010 | Satoh | H01J 27/024 |
| | | | | | 250/492.21 |

* cited by examiner

*Primary Examiner* — Andrew Smyth
(74) *Attorney, Agent, or Firm* — Francis C. Hand; Carella, Byrne, Et Al

(57) ABSTRACT

The extraction electrode has a pair of sub-assemblies that define a gap. Each sub-assembly has a suppression plate and ground plate secured together in spaced relation by pairs of insulating assemblies. A plate assembly extends perpendicularly from the ground plate. The gap between the subassemblies is set by tabs on a centering fixture extension.

8 Claims, 9 Drawing Sheets

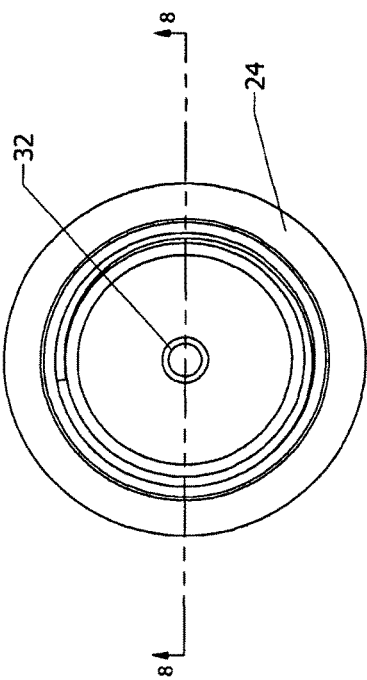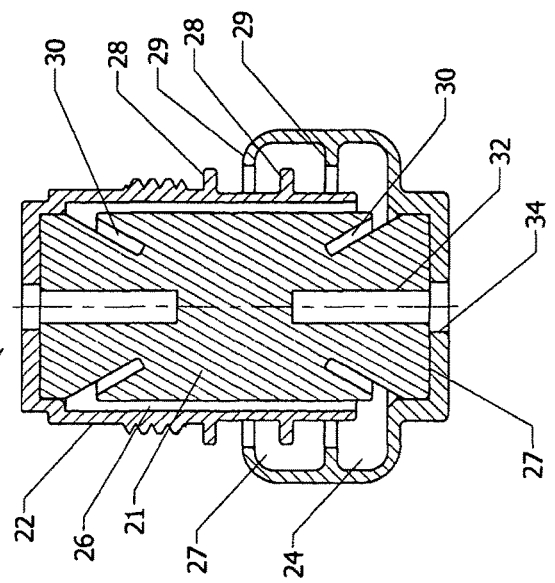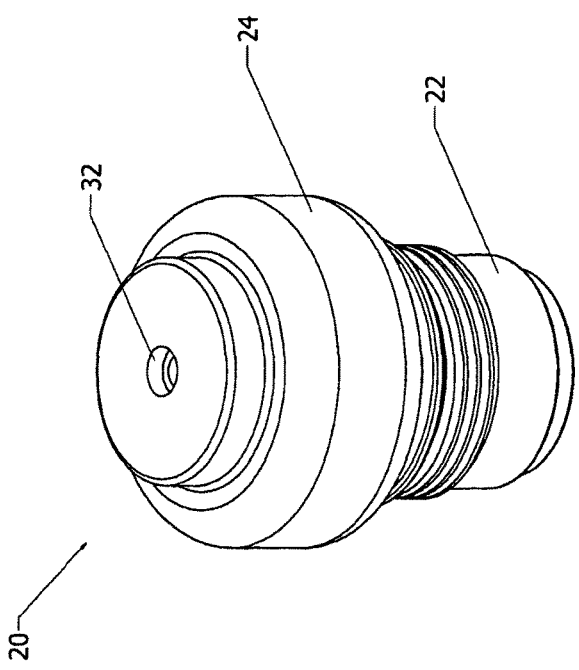

EXTRACTION ELECTRODE

This application relates to an extraction electrode. More particularly, this invention relates to an extraction electrode for an ion implanter. Still more particularly, this invention relates to an extraction electrode for an ion implanter in the field of semiconductor fabrication.

As is known, ion implantation devices employ an extraction electrode for accelerating the ions of an ion beam for implantation in a semiconductor wafer. For example, U.S. Pat. No. 5,420,415 indicates that a key element in the performance of an ion implantation apparatus is how accurately the generated ion beam path corresponds to a desired predetermined beam travel path. Ions generated in the ionization or arc chamber exit the chamber through an elongated aperture or arc slit. The ions are accelerated along a beam path by an electric field generated by an energized extraction electrode located near the arc chamber. The extraction electrode is comprised of two semicircular disk halves which are spaced apart forming an elongated gap through which the ions travel.

U.S. Pat. No. 7,145,157 posits that the positioning of electrodes, such as the extraction electrodes, relative to the other parts of the ion implanter can affect the characteristics of the ion beam including beam energy, beam size and beam shape. To align the extraction electrodes of the ion implanter, various devices have been proposed. For example, special set up tools or jigs have been used to align the electrodes for installation into the extraction electrode assembly. These set up tools have often included dowels or other alignment surfaces which are received in corresponding alignment apertures of the electrodes. Each electrode upon being aligned using the setup tool is typically fastened in place within the extraction electrode assembly using suitable fasteners such as screw fasteners. The setup tool is then removed from the extraction electrode assembly. This procedure is typically repeated each time the electrode is replaced.

U.S. Pat. No. 7,842,931 describes an extraction electrode manipulator system of complex construction.

Accordingly, it is an object of the invention to reduce the number of parts required to fabricate an extraction electrode for an ion implanter.

It is another object of the invention to provide an extraction electrode for an ion implanter that has an extended life and is of reduced weight.

It is another object of the invention to provide an improved assembly extension fixture for holding and centering an extraction electrode.

Briefly, the invention provides an extraction electrode for an ion implanter comprised of a pair of sub-assemblies that define a gap therebetween.

Each sub-assembly of the extraction electrode includes a suppression plate, a ground plate, insulating assemblies between the suppression plate and ground plate and a plate assembly.

Each suppression plate is of semi-circular shape and has a rectangular notch in a side thereof facing a suppression plate of the other sub-assembly. A cover is also disposed over the notch and is spaced from a cover of the other subassembly to define a slit therewith.

Each ground plate is spaced from the suppression plate of the subassembly and has a notch in a side thereof in alignment with the notch of the suppression plate.

The insulating assemblies constitute a pair of insulating assemblies that are connected to and between the suppression plate and the ground plate of each subassembly.

Each plate assembly extends perpendicularly from the ground plate of a subassembly.

In addition, a shield is secured to the ground plate of each sub-assembly and is disposed within the notch of the suppression plate and within the notch of the ground plate to define a path for an ion beam thereby. This shield has a protruding surface disposed over the notch of the ground plate to protect the ground plate from erosion during use.

The extraction electrode can be mounted on an original equipment fixture via a centering fixture extension. In this case, the centering fixture extension has a plurality of clamps for clamping the extraction electrode to extension as well as a pair of tabs that project into the extraction electrode between the sub-assemblies to set the gap therebetween.

A pair of mounting arms may also be secured to opposite ends of the two plate assemblies of the extraction electrode to extending laterally thereof.

These and other objects and advantages of the invention will become more apparent from the following detailed description taken in conjunction with the accompanying drawings wherein:

FIG. 6 illustrates a perspective view of an insulator used in the extraction electrode of FIG. 1;

FIG. 7 illustrates a top view of the insulator of FIG. 6;

FIG. 8 illustrates a cross-sectional view of the insulator of FIG. 8;

Figure 1:
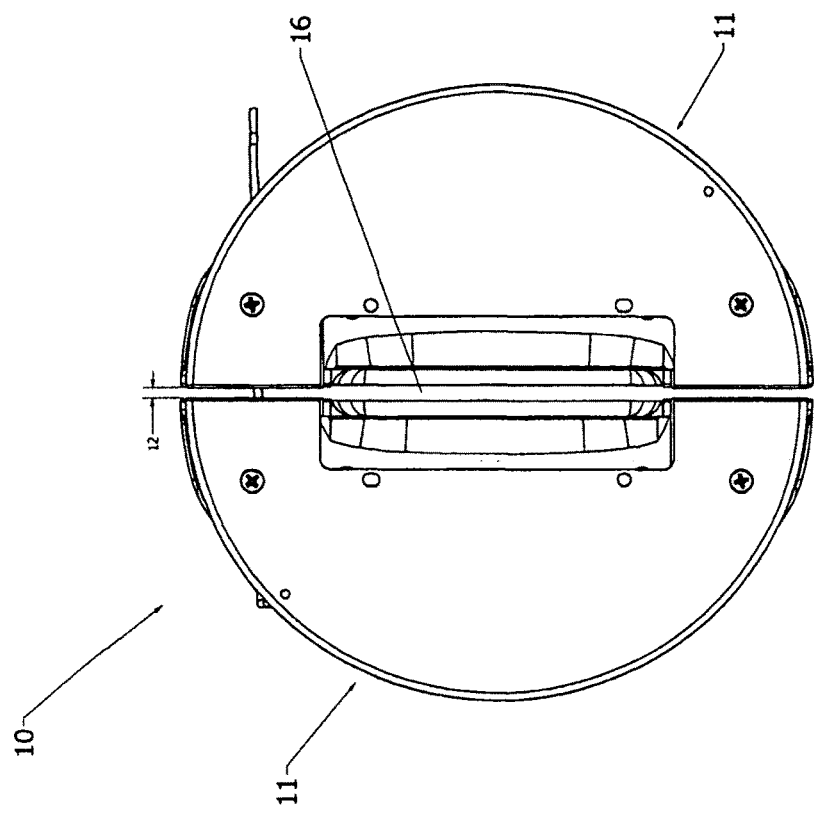
FIG. 1 illustrates a perspective front view of an extraction electrode constructed in accordance with the invention.

Referring to FIG. 1, the extraction electrode 10 is constructed for use in an ion implanter (not shown) and is of compact construction. The electrode 10 is made of a pair of sub-assemblies 11 that define a gap 12 therebetween.

Figure 2:
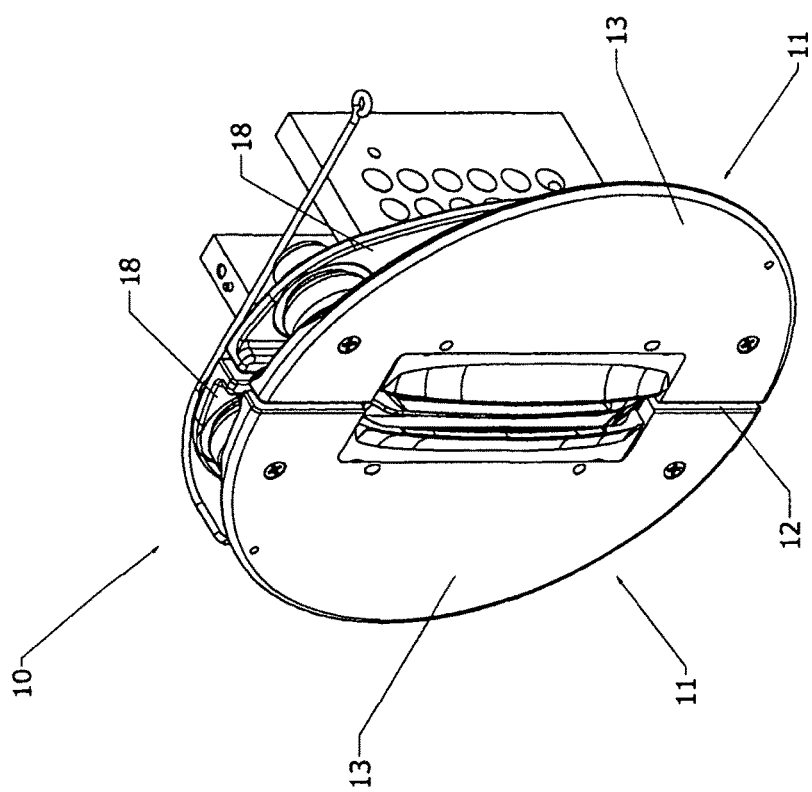
FIG. 2 illustrates a front view of the extraction electrode of FIG. 1.
Figure 3:
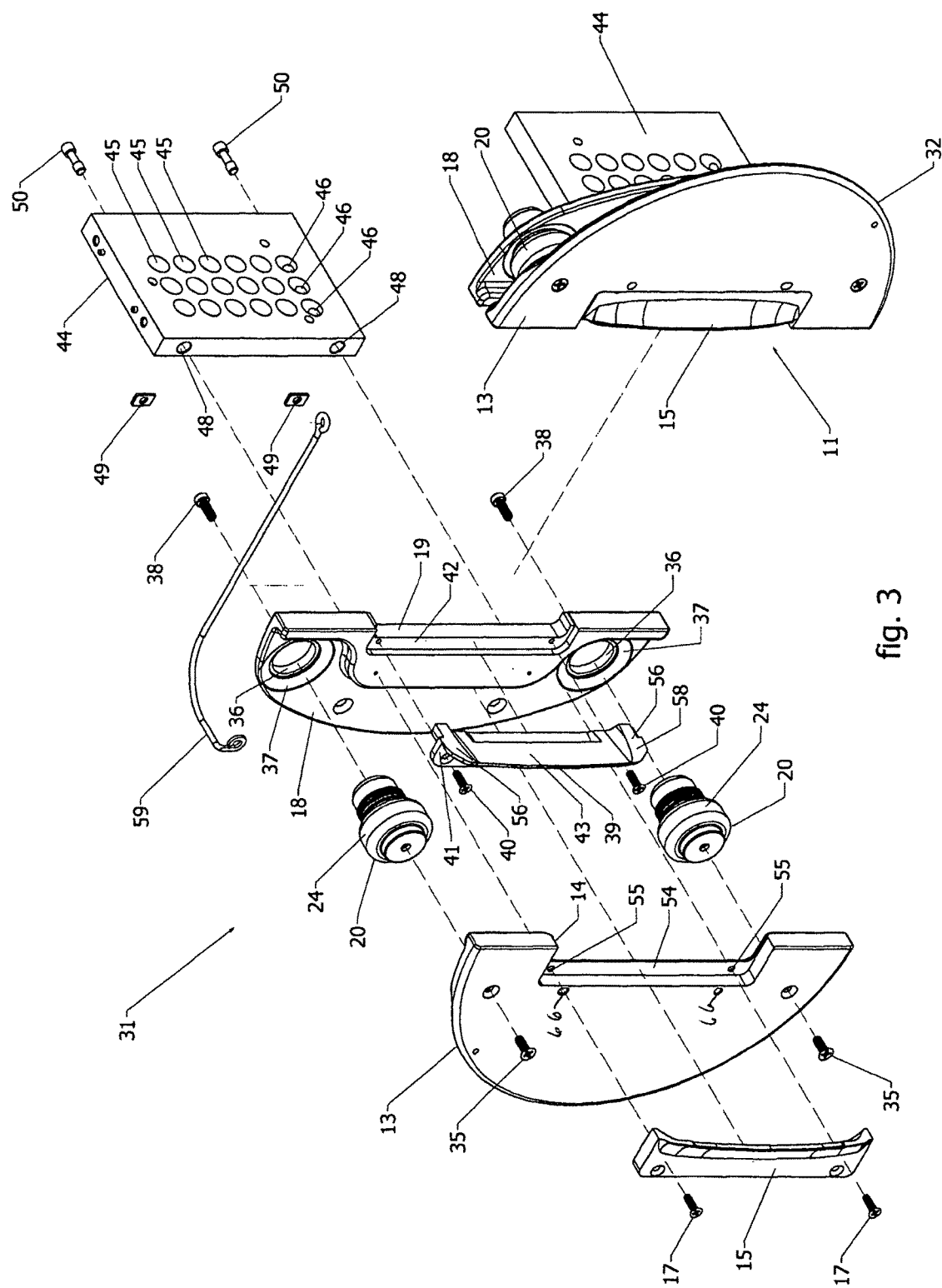
FIG. 3 illustrates an exploded view of the extraction electrode of FIG. 1.

Referring to FIGS. 1 to 3, each sub-assembly 11 includes a suppression plate 13 of semi-circular shape having a rectangular notch 14 in a side thereof facing a suppression plate 13 of the other of the pair of sub-assemblies 11. A cover 15 is also disposed over the notch 14 of each suppression plate 13 and is spaced from a cover 15 of the other of the pair of subassemblies 11 to define a slit 16 (see FIG. 2) therewith. As illustrated, each cover 15 is secured by a pair of screws 17 to the suppression plate 13.

Each sub-assembly 11 also includes a ground plate 18 spaced from the suppression plate 13. As shown, each ground plate 18 is of semi-circular shape and has a notch 19 in a side thereof in alignment with the notch 14 of a suppression plate 13. As indicated, the outer diameter of the two ground plates 18 of the extraction electrode 10 is less than the outer diameter of the two suppression plates 13.

Referring to FIG. 3, a pair of insulating assemblies 20 is provided between the suppression plate 13 and ground plate 18 of each sub-assembly 11.

Referring to FIG. 8, each insulating assembly 20 is made of an insulating standoff 21 of cylindrical shape made of ceramic material, a stainless steel shielding cup 22 that receives one end of the standoff 21 in a central recess 23 in mated manner and a second stainless steel shielding cup 24 that receives the opposite end of the standoff 21 in a central recess 25 in mated manner. The inner shielding cup 22 has a cylindrical section that forms an annular gap 26 with the standoff while the outer shielding cup 24 concentrically surrounds the inner shielding cup 22 to form a passage 27 that communicates with the gap 26. External flanges 28 are provided on the inner shielding cup 22 opposite internal flanges 29 provided on the outer shielding cup 24 to form a labyrinth-like path between the overlapping ends of the two cups 22, 24. The labyrinth path improves the metallic material trap to avoid a short-circuit.

As illustrated, each end of the insulating standoff 21 has an annular groove or slot 30 disposed at an acute angle to the longitudinal axis 31 as well as a blind bore 32 disposed on the longitudinal axis 31. Each groove 30 serves to improve the metallic material trap during a plasma process to avoid a short circuit.

In addition, the inner cup 22 has a central aperture 33 in a flat end thereof aligned with one blind bore 32 and the outer cup 24 has a central aperture 34 in a flat end thereof aligned with the other blind bore 32.

Referring to FIGS. 6 and 7, the outer shielding cup 24 has a greater outside diameter than the inner shielding cup 22 to impart a T-shaped profile to the insulating assembly 20.

Referring to FIG. 3, each insulating assembly 20 is secured by a flat head screw 35 to a suppression plate 13. As indicated, each screw 35 passes through a suppression plate 13, the aperture 34 in the outer cup 24 and threads into a blind bore 32 in the insulating standoff 21.

The opposite end of each insulating assembly 20 passes through an aperture 36 in a ground plate 18. As indicated, each aperture 36 has a rounded entrance shoulder 37 so that the outer cup 24 fits against the shoulder 37 to space the suppression plate 13 from the ground plate 18, while the smaller diameter inner cup 22 passes through the aperture 36.

Referring to FIG. 3, a socket head cap screw 38 [45 in the original] is provided to thread into the blind bore 32 of an insulating assembly 20 to secure the inner shielding cup 22 in place.

Figure 4:
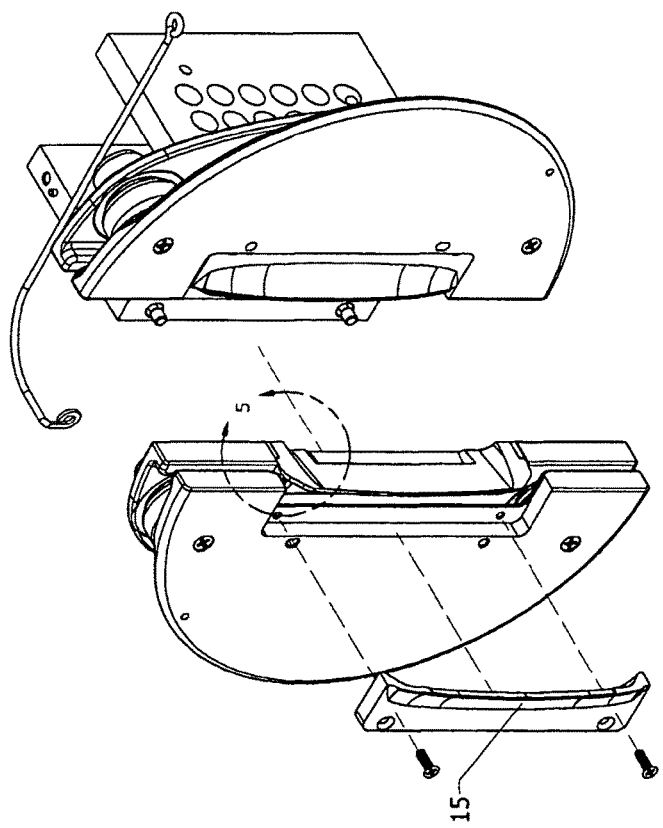
FIG. 4 illustrates a partially exploded view of the extraction electrode of FIG. 1.

Referring to FIGS. 3 and 4, a shield 39 is secured to the ground plate 18 by a pair of screws 40 and is disposed within the notch 14 of the suppression plate 13 and within the notch 19 of the ground plate 18 to define a path for an ion beam thereby while shielding the suppression plate 13 and the ground plate 18. As indicated, the shield 39 has a flat mounting flange 41 that fits into a recess 42 in the ground plate 18 and a perpendicularly disposed shielding flange 43 that extends on one end into the notch 19 of the ground plate 18 to shield the ground plate 18 and that extends on the opposite end into the notch 14 of the suppression plate 13 to shield the suppression plate 13. The shield 39 is made of graphite.

Figure 10:
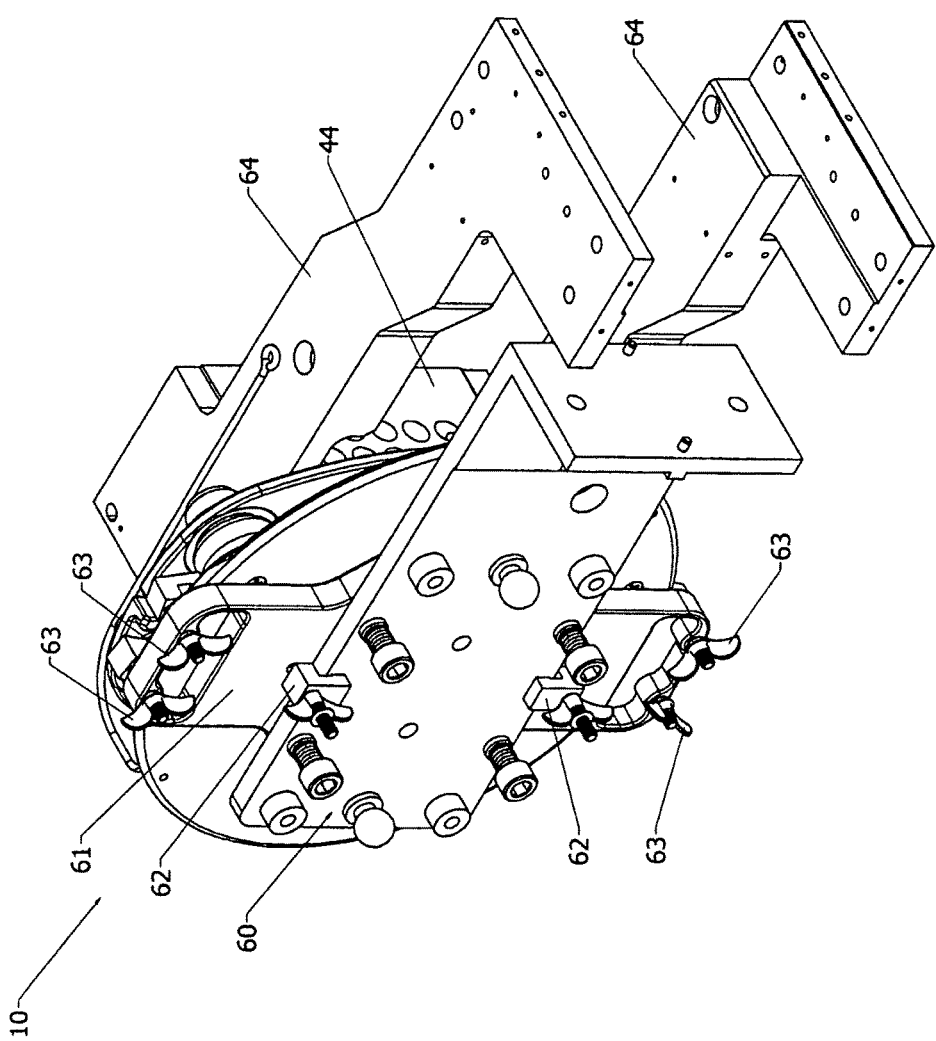
FIG. 10 illustrates a perspective view of the extraction electrode of FIG. 1 mounted in an OEM assembly fixture.

Referring to FIG. 3, a plate assembly 44 extends perpendicularly from each ground plate 18 of a sub-assembly 11 to form a mounting base between the extraction electrode 10 and an assembly mounting arm (see FIG. 10).

Figure 9:
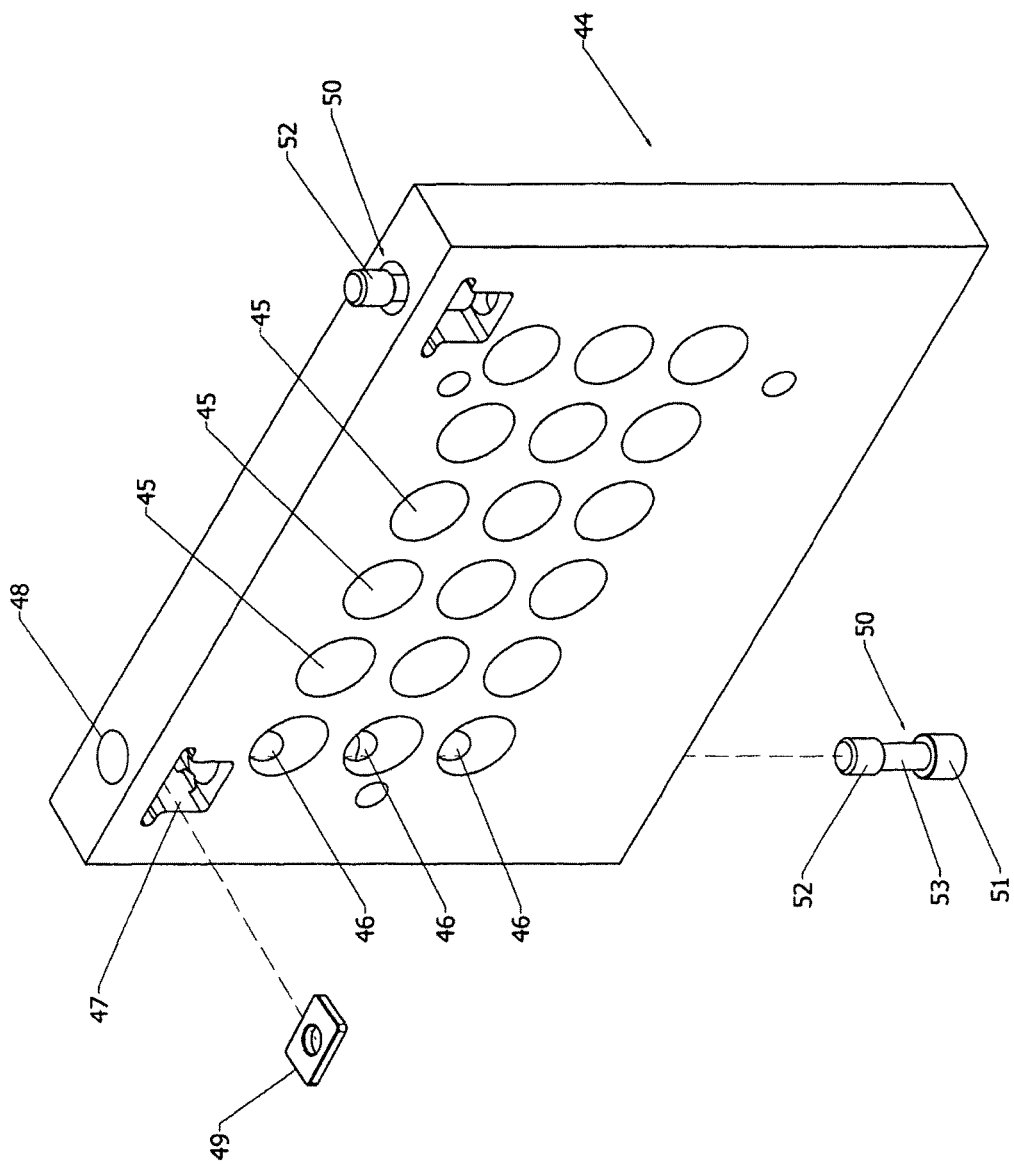
FIG. 9 illustrates an exploded view of the plate assembly used in the extraction electrode of FIG. 1.

Referring to FIGS. 3 and 9, the plate assembly 44 is of rectangular plate shape and is made of aluminum with a regular pattern of apertures 45 that pass through from side-to-side. In addition, each aperture in the bottom row of apertures, as viewed in FIG. 3, has a recess 46.

Referring to FIG. 9, each plate assembly 44 has a pair of T-shaped recesses 47, one in each of two corners, each of which communicates with a circular bore 48 that passes entirely through the plate assembly 44 and terminates in the edge of the plate assembly 44. Each recess 47 receives an internally threaded washer 49 within the flange of the recess 47 while the web of the recess 47 receives a socket head cap screw 50.

Each socket head cap screw 50 has a first cylindrical end section 51 of larger diameter than a second cylindrical end section 52 with a reduced diameter central section 53. The smaller diameter second cylindrical end section 52 has an external thread (not shown) and is sized to pass through the washer 49 and out through the bore 48 in the edge of the plate assembly as indicated in FIG. 9. The larger diameter end section 51 abuts the threaded washer 49 and cannot be passed out of the bore 48.

The first end section 51 of each cap screw 50 has a socket (not shown) that receives a tool (not shown) that is sized to pass into the bore 48 and engage in the end section 51 for rotating the cap screw 50.

Each ground plate 18 has a pair of threaded bores (not shown) on the side facing the plate assembly 44, each of which threadably receives an end section 51 of a cap screw 50 that projects from the plate assembly 44 upon rotation of the tool extending through the bore 48.

Referring to FIG. 3, each cover 15 is fitted into a respective suppression plate 13 to provide a smooth outer surface with a rounded roof 15' facing the opposed cover 15. For example, as shown in FIG. 3, each suppression plate 13 has a lip 54 projecting into the notch 14 on which the cover 15 rests. The thickness of the cover 15 is such that the surface of the cover 15 is co-planar with the surface of the suppression plate 13. As illustrated, the screws 17 are threaded into threaded bores 55 in the lip 54 to secure the cover 15 in place.

Figure 5:
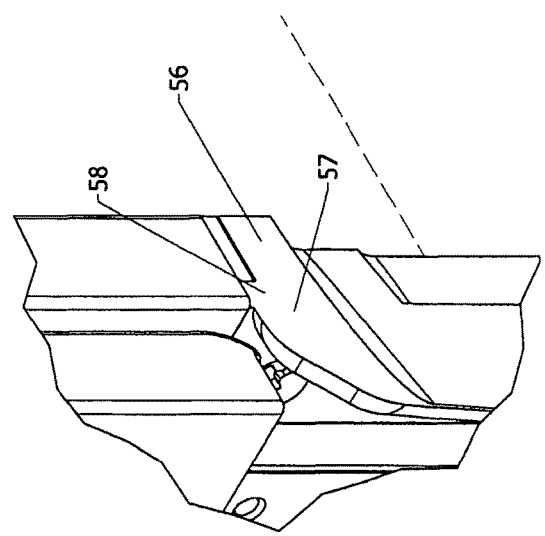
FIG. 5 illustrates a detailed perspective view of a shield within the extraction electrode of FIG. 1.

Also, each shield 39 is fitted into the ground plate 18 to provide smooth surfaces therebetween. For example, as shown in FIGS. 3 and 4, the shielding flange 43 of a shield 39 has a transverse cross-section of channel shape with two raised shoulders 56. As indicated in FIG. 5, each shoulder 56 has a flat surface 57 that is co-planar with the edge surface of a ground plate 18. In addition, each shoulder 56 has a tab 58 that abuts the ground plate 18 within the notch 19 to act as a means to position the shield within the notch 19.

The shielding flange 43 also has a longitudinal cross-section such that the end of the flange 43 that extends into the notch of the ground plate 18 is stepped relative to the end of the flange 43 that extends into the notch 14 of the suppression plate 13. Also, the end of the flange 43 that extends into the notch 14 of the suppression plate 13 is rounded to fit into and complement the rounded shape of the roof 15' of the cover 15 as indicated in FIG. 4.

Referring to FIG. 1, a strap 59 is electrically connected at one end to the suppression plate 13 of one of the sub-assemblies, for example by a screw (not shown) for connection to a source of electrical power. The opposite end of the strap 59 is to be connected to a power supply to bias the electrode 10.

The extraction electrode 10 is, thus, of compact construction and is made with a minimum of parts that can be readily assembled.

Figure 12:
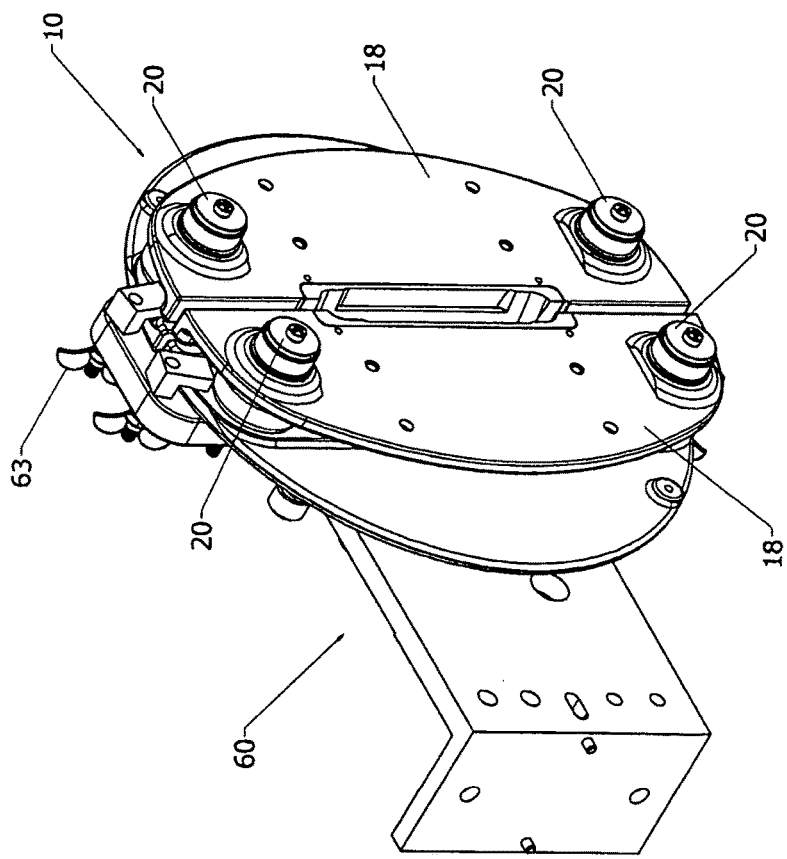
FIG. 12 illustrates a perspective view of the mounting of the extraction electrode from the backside of FIG. 10.

Referring to FIGS. 10 and 12, the extraction electrode 10 may be secured to an original equipment fixture 60 of conventional structure that need not be further described via a centering fixture extension 61.

Figure 11:
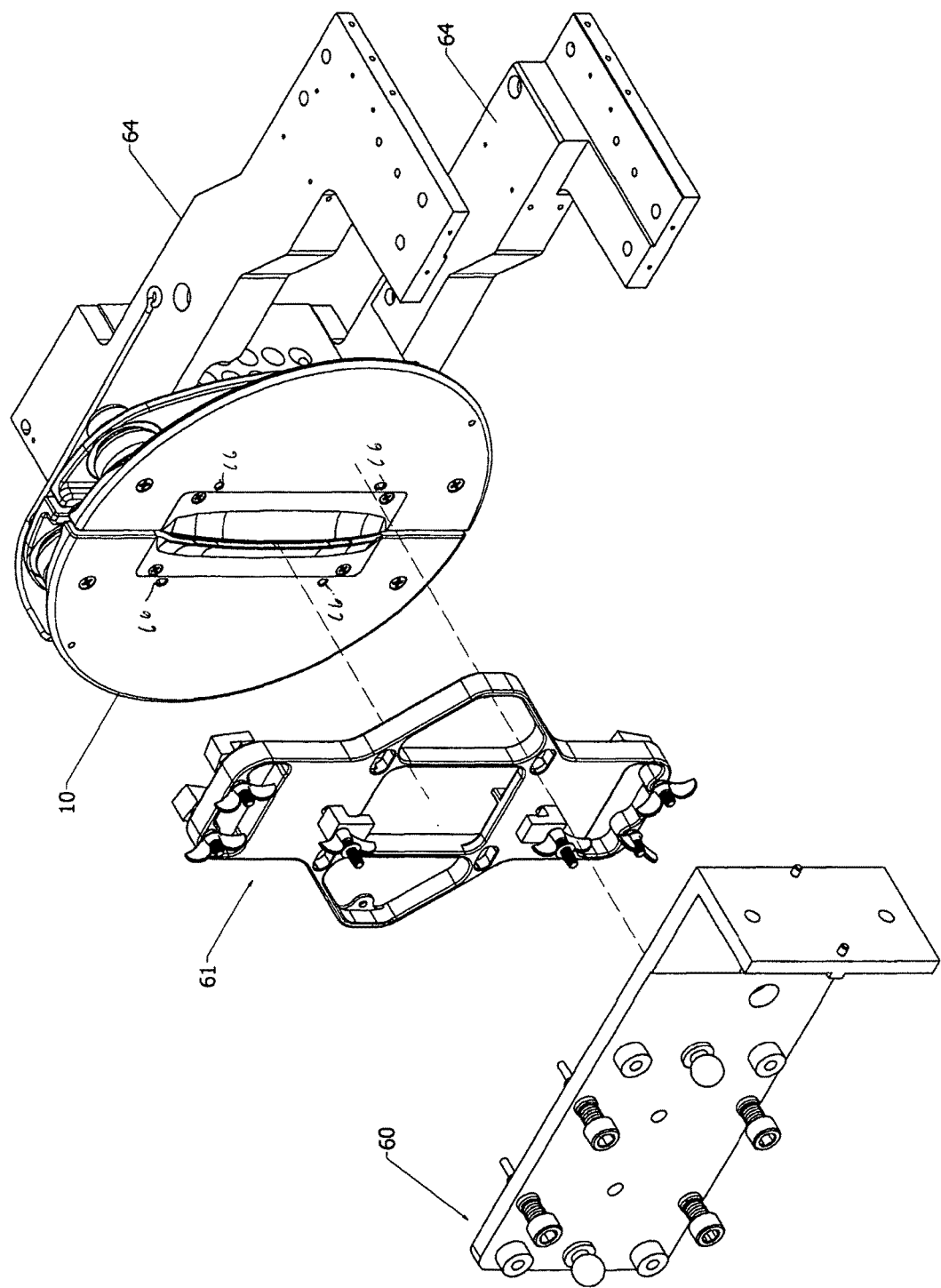
FIG. 11 illustrates an exploded view of the extraction electrode and assembly fixture of FIG. 10 in accordance with the invention.

Referring to FIG. 11, the centering fixture extension 61 is in the form of a cross-piece that is mounted on the original equipment fixture 60 by a pair of adjustable clamp assemblies 62 that engage over opposite sides of the original equipment fixture 60. In addition, the centering fixture extension 61 has a pair of clamp assemblies 63 at each of two ends that clamp over the suppression plates 13 of the extraction electrode 10.

A pair of mounting arms 64 are also secured to opposite ends of the plate assembly 44 of each sub-assembly 11 and extend laterally thereof. As illustrated, one mounting arm 64 is secured to and over the top of the two plate assemblies 44, while the other mounting arm 64 is secured to and below the bottoms of the two plate assemblies 44. Each arm 64 is of conventional structure and need not be further described.

Figure 13:
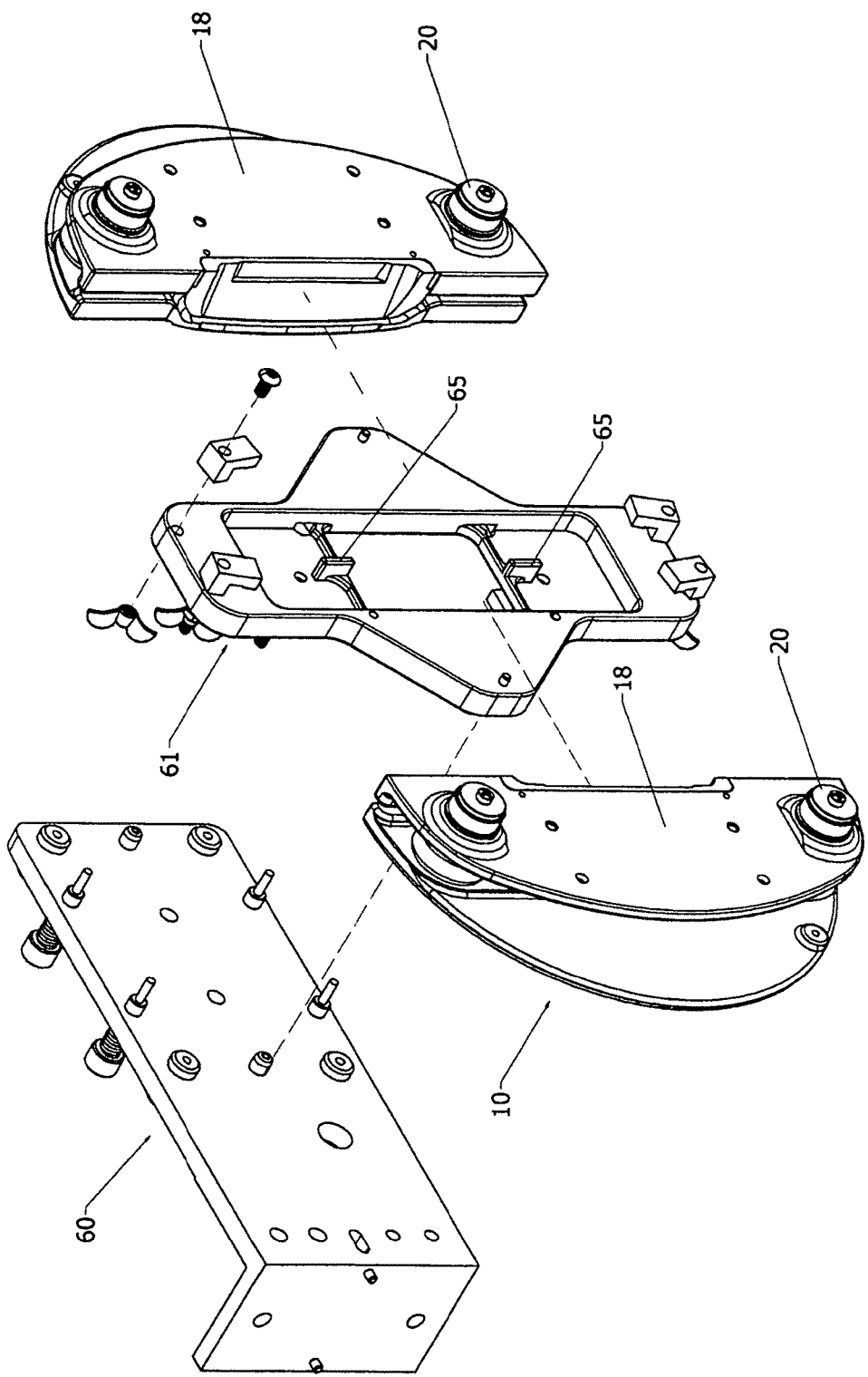
FIG. 13 illustrates an exploded view of the backside of the extraction electrode as mounted on the assembly fixture of FIGS. 10 to 12 in accordance with the invention.

Referring to FIG. 13, wherein like reference characters indicate like parts as above, the centering fixture extension 61 has a pair of vertically aligned tabs 65 that project into the extraction electrode 10 between the sub-assemblies 11 to set the precision gap 12 therebetween.

Referring to FIGS. 3 and 11, a pair of alignment holes 66 may also be placed in each suppression plate 13 adjacent the notch 14 for aligning the original equipment fixture 60.

The invention thus provides an extraction electrode for an ion implanter that is made with a reduced number of parts and an extraction electrode that has an extended life and is of reduced weight.

The invention also provides an extraction electrode that has an improved centering extension fixture for holding and centering the extraction electrode.

What is claimed is:

1. An extraction electrode for an ion implanter comprising a pair of sub-assemblies defining a gap therebetween; each said sub-assembly including
    a suppression plate of semi-circular shape having a rectangular notch in a side thereof facing a suppression plate of the other of said pair of sub-assemblies,
    a cover disposed over said notch of said suppression plate and spaced from a cover of the other of said pair of subassemblies to define a slit therewith,
    a ground plate spaced from said suppression plate and having a notch in a side thereof in alignment with said notch of said suppression plate,
    a pair of insulating assemblies connected to said suppression plate and passing through said ground plate, said insulating assemblies spacing said suppression plate from said ground plate,
    a shield secured to said ground plate and disposed within said notch of said suppression plate and within said notch of said ground plate to define a path for an ion beam thereby, and
    a plate assembly extending perpendicularly from said ground plate.

2. An extraction electrode as set forth in claim 1 further comprising a strap electrically connected at one end to said suppression plate of one of said sub-assemblies for connection to a source of electrical power.

3. An extraction electrode as set forth in claim 1 wherein said shield has a shielding flange disposed over said notch of said ground plate to protect said ground plate from erosion during use.

4. An extraction electrode as set forth in claim 1 wherein each said insulating assembly includes a first shielding cup, a second shielding cup opposite said shielding cup and disposed about said first shielding cup to define a first annular gap therebetween and an insulating standoff secured to and between said first cup and said second cup to define a second annular gap between said insulating standoff and said first shielding cup in communication with said first annular gap to define an optically dense path.

5. An extraction electrode as set forth in claim 1 wherein said plate assembly includes a pair of bores at one end thereof facing said ground plate, a pair of openings transverse to and in communication with said bores, an internally threaded washer within each said opening in alignment with a respective one of said bores, and a pair of socket head cap screws, each said cap screw having a reduced diameter end extending through a respective washer and externally of a respective bore into said ground plate and an enlarged diameter end abutting said washer within a respective opening.

6. In combination
    an extraction electrode including a pair of sub-assemblies defining a gap therebetween; each said sub-assembly including a suppression plate of semi-circular shape having a notch facing a suppression plate of the other of said pair of sub-assemblies, a ground plate spaced from said suppression plate and having a notch in a side thereof in alignment with said notch of said suppression plate, a pair of insulating assemblies disposed between said suppression plate and said ground plate to space said suppression plate from said ground plate, and a plate assembly extending perpendicularly from said ground plate;
    a centering fixture extension having a plurality of clamps for clamping said extraction electrode to said extension; and
    an original equipment fixture secured to said extension.

7. The combination as set forth in claim 6 further comprising a pair of mounting arms secured to opposite ends of said plate assembly of each said sub-assembly and extending laterally thereof.

8. The combination as set forth in claim 6 wherein said centering fixture extension has a pair of tabs projecting into said extraction electrode between sub-assemblies thereof to set a gap therebetween.

* * * * *